March 22, 1966 D. J. CARLSON ETAL 3,242,433
UHF ADAPTOR FOR VHF TELEVISION RECEIVERS
Filed Aug. 13, 1962
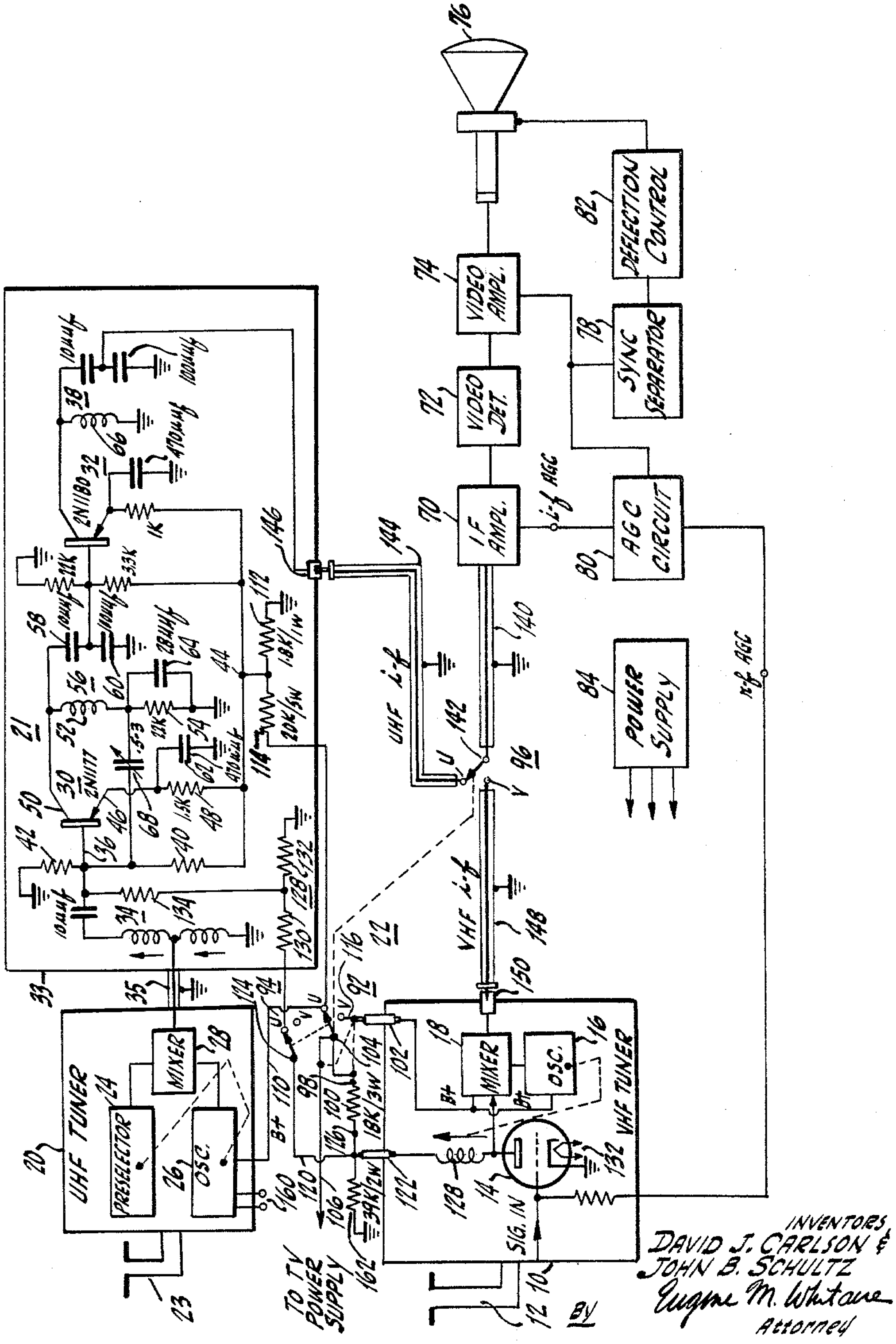
INVENTORS
DAVID J. CARLSON &
JOHN B. SCHULTZ
BY Eugene M. Whitacre
Attorney 3,242,433

UHF ADAPTOR FOR VHF TELEVISION RECEIVERS

David J. Carlson, Princeton, and John B. Schultz, Haddonfield, N.J., assignors to Radio Corporation of America, a corporation of Delaware Filed Aug. 13, 1962, Ser. No. 216,642
7 Claims. (Cl. 325—461)

This invention relates to television receivers and more particularly to adaptors for adapting television receivers to receive ultra high frequency (UHF) television signals in addition to very high frequency (VHF) signals.

Conventional television receivers, which include only a VHF television tuner, require the addition thereto of a UHF television tuner in order to be capable of receiving UHF television signals. While a UHF tuner can be conveniently added to most television receivers, a problem in UHF signal reception is presented because UHF tuners exhibit a conversion loss when converting UHF signals to the predetermined intermediate frequency (I.-F.) of the receiver. This conversion loss is primarily due to the absence of a radio frequency (R.-F.) amplifier in UHF tuners. The VHF tuner usually exhibits a conversion gain when converting VHF signals to I.-F. signals. It is desirable that the I.-F. signals from the UHF tuner be preamplified before application to the I.-F. amplifier of the receiver so that they exhibit a signal level equivalent to the I.-F. signals from the VHF tuner.

Heretofore some television receiver manufacturers when adding a UHF tuner to their receiver, also adapted their receivers to utilize the signal translating stages of the VHF tuner as a preamplifier for I.-F. signals from the UHF tuner. Such an adaptation requires that the VHF tuner chassis be opened to make internal changes in the circuitry therein. This is not desirable. It is preferable to provide an adaptor circuit comprising a UHF tuner and a separate I.-F. preamplifier therefor, both of which can be added to a television receiver without making internal changes in the VHF tuner circuitry.

Accordingly, it is an object of this invention to provide an adaptor circuit including a UHF tuner and an I.-F. preamplifier which enables a VHF television receiver to receive UHF television signals, and which may be added to the television receiver without making internal changes in the circuitry of the VHF tuner thereof.

The inclusion of a vacuum tube preamplifier in such an adaptor circuit is often not satisfactory inasmuch as some television receivers have power supplied which would be overloaded by the addition of such a vacuum tube circuit. Furthermore such vacuum tube circuits are also bulky and space and thermal limitations also often preclude their use in some receivers. A transistor I.-F. preamplifier on the other hand can be conveniently mounted on a UHF tuner chassis and both components added to a television receiver without the problems of space or power supply limitations arising. However, the addition of a transistor circuit to a vacuum tube television receiver results in a hybrid combination which makes automatic gain control (AGC) of the transistor I.-F. preamplifier difficult to achieve. This is because the AGC circuit utilized in vacuum tube television receivers to control the gain of the VHF tuner is an extremely high impedance circuit and develops little power or current. Since the R.-F. vacuum tube amplifier in the VHF tuner, which is the tube controlled by the AGC circuit, is a voltage controlled device, it does not need to draw power or current from the AGC circuit. Therefore, such a high impedance AGC circuit is effective in controlling the gain of the VHF tuner. However, a transistor exhibits a low input impedance and requires a significant amount of power or current as compared to a vacuum tube to control the gain thereof. Consequently, such existing high impedance AGC circuits cannot be effectively utilized to control the gain of the transistor preamplifier in the UHF adaptor circuit in the same manner in which the VHF tuner is controlled. It is however important that the gain of the UHF adaptor circuit be automatically controlled by the AGC circuit of the television receiver to affect the same AGC characteristic as the VHF tuner and without adding additional active circuit elements to effect such control.

It is therefore another object of this invention to provide an adaptor circuit enabling a television receiver to process UHF signals, which adaptor circuit is automatically gain controlled by the AGC circuit of the receiver.

An adaptor circuit for adapting a vacuum tube television receiver to receive UHF television signals includes a UHF tuner for converting received UHF signals to I.-F. signals, a transistor I.-F. preamplifier for amplifying the said I.-F. signals and switching means having a first position for setting the receiver to receive UHF transmitted television signals and a second position for setting the receiver to receive VHF signals. The switching means are mounted on the television receiver so as to be accessible to a viewer to afford selective control of the type of signals to be received. The transistor preamplifier is mounted directly on the UHF tuner which in turn is mounted in an accessible position in the television receiver to permit tuning to the various UHF channels. All electrical connections which are made to incorporate the adaptor circuit into the television receiver are made without changing the tuning or internal circuitry of the VHF tuner. Thus, the adaptor circuit can be added by television repairmen to VHF television receivers in a viewer's possession.

The adaptor circuit is incorporated in the television receiver so as to be powered by the power supply of the receiver and the transistor I.-F. preamplifier of the adaptor circuit is automatically gain controlled by the AGC circuit of the television receiver.

The automatic gain control circuit of the television receiver develops a gain control voltage as a function of received signal level. The gain control voltage which is usually delayed is developed in a high impedance circuit and is applied to the R.-F. amplifier in the VHF tuner to control the gain thereof after the received signals exceed a predetermined level.

In an adaptor circuit embodying the invention, the AGC voltage for the transistor I.-F. preamplifier is derived from the R.-F. amplifier in the VHF tuner which operates as a D.C. amplifier when the television receiver is set for UHF reception. Thus the R.-F. amplifier is maintained energized during both VHF and UHF reception while the switching means deenergizes the other circuit elements in the VHF tuner during UHF reception. Thus the low power AGC circuit of the television receiver in VHF reception is transformed into a high power AGC circuit for UHF reception without adding additional amplifying circuits to the television receiver. This provides substantially identical automatic gain control characteristics for both UHF and VHF signals.

The novel features that are considered to be characteristic of this invention are set forth with particularity in the appended claims. The invention itself, however, both as to its organization and method of operation, as well as to additional objects and advantages thereof, will best be understood from the following description when read in conjunction with the accompanying drawing in which the sole figure is a block diagram, partially in schematic form, of a portion of a vacuum tube television receiver embodying the invention.

Referring now to the drawing, a VHF television receiver such as an RCA KCS-136 series chassis which is shown in the publication "Preliminary Service Data" filed 1961, No. T-4 and prepared by the RCA Sales Service Company, 600 North Sherman Drive, Indianapolis, Indiana is shown in combination with the UHF adapter of the invention. The television receiver includes a VHF tuner 10 which is coupled to an antenna 12 for intercepting television signals in the VHF television band. The VHF tuner 10 includes a vacuum tube R.-F. amplifier 14 for selecting and amplifying VHF signals. The tuner 10 also includes a vacuum tube local oscillator 16 for generating local oscillatory signals and a vacuum tube mixer 18 for mixing the applied VHF input signals and local oscillatory signals to produce an intermediate frequency output.

The adaptor circuit of the invention comprises a UHF tuner 20 for converting UHF television signals to the predetermined I.-F. signals of the receiver, a transistor I.-F. preamplifier 21 for amplifying the said I.-F. signals and switching means 22 for selectively setting the receiver for either UHF or VHF reception. The UHF television tuner 20 is coupled to an antenna 23 for receiving the UHF signals. In strong signal areas the UHF antenna 23 may be the same as the VHF antenna 12. The UHF tuner 20 includes a double tuned preselector 24 for selecting any one of a plurality of UHF television signals and a vacuum tube local oscillator 26 for generating local oscillatory signals. A semiconductor diode mixer 28 mixes the received UHF and the locally generated oscillatory signals to provide an I.-F. signal output having the same frequency as the VHF I.-F. signals.

The I.-F. signal output from the UHF tuner 20 is applied to the two stage transistor I.-F. preamplifier 21 which includes the transistors 30 and 32. The transistor preamplifier 21 is constructed on a chassis 33 which is physically mounted on the UHF tuner 20 chassis and a coaxial cable 35 is connected from the UHF tuner 20 to a tuned input circuit 34 for the transistor preamplifier 21. The tuned input circuit 34 is coupled to the base electrode 36 of the first transistor 30, and amplified I.-F. output signals are derived from a tuned output circuit 38 coupled to the collector electrode of the second transistor 32. The transistor 30 is biased by connecting the base electrode 36 to the junction of a pair of voltage dividing biasing resistors 40 and 42 which are coupled between a positive potential supply terminal 44 and ground, and by connecting the emitter electrode 46 to the terminal 44 through a resistor 48. The biasing path is completed by coupling the collector electrode 50 of the transistor 30 through an inductor 52 and a resistor 54 to ground. The inductor 52 comprises a portion of a tuned output circuit 56, for the first stage transistor 30, which tuned circuit also includes the capacitors 58 and 60. The resistors 48 and 54 are shunted by the capacitors 62 and 64 respectively.

The transistor 32 is biased similarly to the transistor 30 with the exception that the inductor 66 of the tuned output circuit 38 thereof is connected directly to ground. The base electrode of the transistor 32 is connected to the capacitors 58 and 60 in the tuned output circuit 56 of the junction of the capacitors 58 and 60 in the tuned output circuit 56 of the first stage transistor 30 to receive I.-F. signals therefrom.

The first stage transistor 30 also includes a variable capacitor 68 coupled from the junction of the inductor 52 and the resistor 54 to the base electrode 36. The capacitor 68 neutralizes the transistor 30 to prevent parasitic oscillation from developing therein.

I.-F. output signals derived from either the transistor preamplifier or from the VHF tuner 10 are applied to an I.-F. amplifier 70 in the television receiver and then detected in a video detector 72. The composite signal output from the detector 72 includes a video signal which is amplified by a video amplifier 74 and applied to a picture tube 76. The composite video signal is also applied from the video amplifier 74 to a synchronizing signal separator 78 and an AGC circuit 80. The sync separator 78 separates the synchronizing pulses and applies them to deflection control circuits 82 which control the deflection of the electron ray beam in the picture tube 76. Power is supplied to the television receiver from a power supply 84.

The AGC circuit 80 develops a first gain control voltage as a function of received signal level and this voltage is applied to the I.-F. amplifier 70 to control the gain thereof. The AGC circuit 80 also develops a second gain control voltage which may be initially positive, and this voltage is coupled back to the input grid circuit of the R.-F. amplifier 14 in the VHF tuner 10. The second or R.-F. AGC voltage, is clamped to ground potential by the rectifying action of the grid and cathode of the R.-F. amplifier tube and is therefore delayed with respect to the first or I.-F. AGC voltage until the signal level is large enough to overcome the positive delay. Such a delay contributes to the maintenance of good noise figures for the television receiver since the R.-F. amplifier 14 is operated at full gain at low input signal levels, but operates at reduced gain at high signal levels. The second gain control voltage is developed in an extremely high impedance circuit and therefore cannot effectively control the gain of the transistor preamplifier 21 if applied directly thereto.

In an adaptor circuit embodying the invention, the AGC voltage developed in a television receiver is utilized to control the gain of the receiver during reception of UHF television signals similar to the manner in which the gain is controlled during the reception of VHF signals. This is accomplished by utilizing the R.-F. amplifier 14 in the VHF tuner 10 as a D.C. power amplifier for effectively transforming the second gain control voltage, derived from a high impedance source, into an amplified gain control voltage, from a source having a much lower impedance.

In the adapter shown in the drawings, the switching means 22 are included to adapt the receiver for the reception of either VHF or UHF transmitted television signals. Thus, the switching means 22 is conveniently mounted on the television receiver cabinet to be readily accessible by a viewer. The switching means 22 may, for example, comprise a wafer type switch which includes a plurality of sections 92, 94 and 96, ganged together for simultaneous operations. The switch sections 92, 94 and 96 are connected as single-pole, double-throw switches, and are supplied with the adapter unit. When the switching means 22 are set in the first or U position, the television receiver is adapted for the reception of UHF signals, and when set in the second or V position, the receiver is adapted for the reception of VHF signals. It is to be noted that such type of switching immediately sets the television receiver for reception of UHF signals without requiring the viewer to move the VHF channel selector to the channel 13 or UHF position thereon, as is necessary in many VHF-UHF television receivers.

The switch section 92 is connected into an existing television receiver so that when set in the U position thereof, the UHF tuner 20 and the transistor preamplifier 21, as well as the R.-F. amplifier 14 are all energized. This is accomplished by disconnecting the high potential terminal 98 of the load resistor 100 of the R.-F. amplifier 14 from the B+ terminal 102 (the original connections being shown by the dashed lines), and connecting the terminal 98 of this resistor to the center or rotor terminal 104 of the switch section 92. Similarly the television receiver B+ lead 106 is disconnected from the B+ terminal 102, and connected to the center terminal 104 of the switch section 92. In most known types of VHF tuners both the B+ terminal 102 and the load resistor 100 are accessible and do not require manipulation of the VHF tuner tuning elements. By these connections, the R.-F. amplifier 14 is connected to the B+ bus lead 106 regardless of the position in which the switch 92 is set, and consequently remains energized in both positions of the switch.

The local oscillator 26 in the UHF tuner 20 is connected to the U terminal of the switch section 92 by means of a conductor 110. Additionally a voltage divider, including the series combination of the resistors 112 and 114, is connected from the U terminal of the switch section 92 to ground, and the energizing potential terminal 44 for the transistor preamplifier 21 is connected to the junction of these resistors. The voltage divider resistors 112 and 114 may be mounted in the transistor preamplifier chassis 33. By these connections, the UHF tuner 20 and the transistor preamplifier 21 are energized when the switch 92 is in the U position.

When the switch section 92 is in the V position, the local oscillator and mixer tubes in the VHF tuner 10 are energized. This is accomplished by connecting a conductor 116 from the B+ terminal 102 to the V terminal on the switch section 92. The internal connections from the mixer 18 and oscillator 16 tubes to the B+ terminal 102 are not disturbed when making these modifications. To sum up, the switch section 92 in the U position energizes the UHF tuner 10 and the transistor preamplifier 21 while deenergizing the local oscillator 16 and the mixer 18 in the VHF tuner. The converse is done when the switch section 92 is set in the V position. In both positions, the R.-F. amplifier 14 remains energized.

The rotor terminal 124 of the switch section 94, is connected to the terminal 122 in the plate circuit of the R.-F. amplifier 14. A voltage divider network 128, comprising the series combination of a pair of resistors 130 and 132, is connected from the U terminal of the switch section 94 to ground. The voltage divider, which may be mounted in the transistor preamplifier chassis 33, is utilized to apply AGC voltage developed across the load resistor 100 of the R.-F. amplifier 14 to the transistor preamplifier 21. A coupling resistor 134 is therefore connected from the junction of the resistors 130 and 132 to the base electrode 36 of the transistor 20. The V terminal of the switch section 94 is left unconnected.

By these connections, the switch section 94, in the U position thereof applies the second automatic gain control voltatge as amplified by the R.-F. amplifier 14 to the transistor I.-F. preamplifier 21 to control the gain thereof. In the V position, the R.-F. amplifier 14 is disconnected from the transistor preamplifier 21.

The switching means 22 also includes the switch section 96 which is utilized to couple the I.-F. signals from either the transistor preamplifier 21 or the VHF tuner 10 to the I.-F. amplifier 70 in the television receiver. Thus a coaxial cable 140 is connected from the center or rotor terminal 142 of the switch section 96 to the I.-F. amplifier 70. A coaxial cable 144 is also connected from the I.-F. output terminal 146 on the transistor preamplifier chassis 33 to the U terminal of the switch 94 while a similar cable 148 is connected from the I.-F. output terminal 150 on the VHF tuner 10 chassis to the V terminal of the switch section 96. The filament heater leads 160 for the local oscillator tube 26 in the UHF tuner 20 are connected by connections not shown to the heater terminals 132 on the VHF tuner 10.

It is to be noted that all these connections may be made simply in the field without altering any of the internal circuitry of an existing television receiver. Thus the adaptor circuit may be readily added to television receivers by relatively unskilled technicians.

As shown, the switch means 22 is in the U position to enable the television receiver to receive UHF signals. UHF signals, selected in the preselector 24 of the UHF tuner 20, are mixed in the mixer 28 with the oscillations from the local oscillator 26, and the I.-F. signal output is applied to the tuned input circuit 34 of the transistor preamplifier 21. A practical transistor preamplifier 21 was designed to exhibit a gain of substantially 35 decibels so that the I.-F. signal output applied to the I.-F. amplifier 70 for UHF reception exhibits a signal level equivalent to the I.-F. signal output of the VHF tuner 10.

When the level of received signal strength is low, the transistor I.-F. preamplifier 21 is operated at full gain. Under this condition, the AGC circuit 89 produces a first gain control voltage which is applied to maintain the gain of the I.-F. amplifier 70 substantially constant. However, when the signal strength of UHF signals exceeds the said predetermined level, tending to overdrive the transistor I.-F. preamplifier 21, the AGC voltage in the circuit 80 becomes sufficiently negative to reduce the gain of the R.-F. amplifier 14. When the grid of the R.-F. amplifier 14 is biased negatively, the conduction through the load resistor 100 decreases. Consequently, the potential at the low potential terminal 126 thereof, and therefore across the voltage divider 128, increases in a positive direction. Such an increase tends to reduce the gain of the transistor 30. Conversely, when the received UHF signal strength decreases, but still remains above the said predetermined magnitude, the negative AGC voltage applied to the amplifier 14 is decreased. The amplifier 14 conducts more heavily and the potential at the terminal 126 of the load resistor 100, and therefore across the voltage divider 128, is less positive. The forward bias of the transistor 30 and the I.-F. signal output from the transistor preamplifier is then increased.

It is to be noted that the R.-F. amplifier 14 functions as a D.C. amplifier for UHF reception. In such operation the amplifier 14 effectively transforms the AGC voltage from a high impedance source into an amplified AGC voltage from a relatively low impedance source, which source impedance is, of course, the combined impedances of the vacuum tube 14 and the impedances shunted thereacross.

In UHF reception, the local oscillator 16 and mixer 18 in the VHF tuner 10 are deenergized and the VHF tuner 10 is disconnected from the R.-F. amplifier 70. Thus, any VHF signals that are received will have substantially no effect on the operation of the television receiver during UHF reception. Similarly, when the switching means 22 is set for VHF reception, the UHF tuner 20 and transistor preamplifier 21 are deenergized and thus UHF signals can have no effect on VHF reception.

In VHF reception, the amplifier 14 functions as a radio frequency amplifier and the operation of the television receiver is exactly the same as it was before the inclusion of the adapter circuit.

Thus, an adapter circuit, which enables a VHF television receiver to receive UHF signals, is provided and the adapter circuit can be added to the receiver by a few simple connections which are made external to the VHF tuner of the receiver. The transistor I.-F. preamplifier, which is incorporated into the adapter circuit to amplify the I.-F. signal output of the UHF tuner, is automatically gain controlled by the AGC circuit of the television receiver. This is accomplished by maintaining the R.-F. amplifier in the VHF tuner energized during the reception of UHF signals and causing the R.-F. amplifier to function as a power or D.C. amplifier for the second or delayed AGC voltage developed in the television receiver. Thus, both the UHF and VHF signals are controlled in substantially the same way in the television receiver.

In a television receiver, of the type heretofore referenced, and including the values of the components shown in the drawing, the following gain control characteristics were attained in two different configurations:

(1) With resistors 40, 42, 130, 132 and 134 equal respectively to 3.3K, 22K, 100K, 18K and o (shorted);

| Gain in db: | AGC voltage |
|---|---|
| maximum | 0.2 |
| —5 | 2.1 |
| —10 | 2.45 |
| —15 | 2.65 |
| —20 | 2.75 |
| —30 | 2.93 |
| —38 | 3.5 |

(2) With resistors 40, 42, 130, 132 and 134 equal respectively to o (shorted), ∝ (removed), 100K, 18K and 1.3K:

| Gain in db | AGC voltage |
|---|---|
| maximum | 0.2 |
| −5 | 0.57 |
| −10 | 0.66 |
| −15 | 0.685 |
| −20 | 0.705 |
| −30 | 0.73 |
| −42.5 | 0.83 |

It is to be noted that the transistor 32 could be automatically gain controlled, in addition to the transistor 30, by coupling the base of the transistor 32 to the junction of the resistors 130 and 132 in the same way the base 36 of the transistor 30 is coupled thereto.

What is claimed is:

1. A UHF adapter circuit for a television receiver of the type including a VHF tuner for converting any one of a plurality of VHF signals to an intermediate frequency signal, said VHF tuner including a radio frequency amplifier, said television receiver also including an intermediate frequency amplifier for amplifying said intermediate frequency signal, a high impedance automatic gain control circuit coupled to said intermediate frequency amplifier for developing a gain control voltage, and means for applying said gain control voltage to said radio frequency amplifier to control the gain thereof, said UHF adaptor circuit comprising in combination:

a UHF tuner for selecting any one of a plurality of UHF television signals and converting said UHF signal to said intermediate frequency signal, means for adapting said television receiver to selectively receive one of said UHF and said VHF signals, a transistor intermediate frequency preamplifier coupled to said UHF tuner to amplify said intermediate frequency signal, means for converting said radio frequency amplifier to operate as a direct voltage amplifier for said automatic gain control voltage during UHF signal reception, and means for applying said amplified automatic gain control voltage to said transistor preamplifier to automatically control the gain of said preamplifier.

2. A UHF adapter circuit for a vacuum tube television receiver of the type including a VHF tuner for selecting anyone of a plurality of VHF television signals and converting said VHF signal to an intermediate frequency signal, said VHF tuner including a radio frequency amplifier having a load resistor coupled to a source of energizing potential in said television receiver, said television receiver also including an intermediate frequency amplifier for amplifying said intermediate frequency signals, a high impedance automatic gain control circuit for developing a gain control voltage as a function of received signal levels, and means for applying said gain control voltage to said radio frequency amplifier to control the gain thereof, said UHF adaptor circuit comprising the combination of:

a UHF tuner for selecting any one of a plurality of UHF television signals and converting said UHF signal to said intermediate frequency signal, a transistor intermediate frequency preamplifier coupled to said UHF tuner for amplifying said intermediate frequency signal, means for coupling said UHF tuner and said transistor preamplifier to said source of energizing potential, means for coupling the load resistor of said radio frequency amplifier to said transistor preamplifier to apply an amplified automatic gain control voltage developed thereacross to said transistor preamplifier to control the gain thereof, and means for selectively applying one of said intermediate frequency signals from said VHF tuner and said transistor preamplifier to the intermediate frequency amplifier in said television receiver.

3. In a UHF adapter circuit including a UHF tuner for selecting any one of a plurality of UHF signals and converting said UHF signal to an intermediate frequency signal to enable a vacuum tube television receiver to receive UHF television signals, said television receiver being of the type including a VHF tuner for selecting any one of a plurality of VHF signals and converting said VHF signal to said intermediate frequency signal, said VHF tuner including a radio frequency amplifier coupled through a load resistor to a source of energizing potential in said television receiver, said television receiver also including an intermediate frequency amplifier for amplifying said intermediate frequency signal, a high impedance automatic gain control circuit for developing a gain control voltage as a function of received signal level, and means for applying said gain control voltage to said radio frequency amplifier to control the gain thereof, said UHF adaptor circuit comprising the combination of:

a transistor intermediate frequency preamplifier coupled to said UHF tuner to amplify said intermediate frequency signal, means for adapting said television receiver to selectively receive one of said UHF and said VHF signals, means including said radio frequency amplifier for providing an amplified version of said automatic gain control voltage during UHF signal reception, and means for applying said amplified gain control voltage to said transistor preamplifier to control the gain of said preamplifier.

4. In a UHF adapter circuit including a UHF tuner for selecting any one of a plurality of UHF signals and converting said UHF signal to an intermediate frequency signal to enable a vacuum tube television receiver to receiver UHF television signals, said television receiver being of the type including a VHF tuner having a radio frequency amplifier for amplifying an intercepted VHF signal, said radio frequency amplifier having a load resistor coupled to a source of energizing potential in said television receiver, said VHF tuner also including a local oscillator for generating an oscillatory signal and a mixer for mixing said VHF and said oscillatory signals to convert said VHF signal to said intermediate frequency signal, said television receiver also including an intermediate frequency amplifier for amplifying said intermediate frequency signal, a high impedance automatic gain control circuit coupled to said intermediate frequency amplifier for developing a gain control voltage as a function of received signal levels and means for applying said gain control voltage to said radio frequency amplifier to control the gain thereof, said UHF adaptor circuit comprising in combination:

a transistor intermediate frequency preamplifier having an input circuit coupled to said UHF tuner and an output circuit, and switching means for selectively adapting said television receiver to receive one of said UHF and said VHF television signals, said switching means having a first position for energizing said UHF tuner and said transistor preamplifier, and for applying to the input circuit of said tranistor preamplifier an amplified version of the said automatic gain control voltage developed across said load resistor to control the gain of said transistor preamplifier, as well as for coupling the output circuit of said transistor preamplifier to said intermediate frequency amplifier to enable said television receiver to process UHF television signals, said switching means having a second position for energizing said local oscillator and said mixer in said VHF tuner, for decoupling said transistor preamplifier from said load resistor, and for coupling said VHF tuner to said intermediate frequency amplifier to enable said television receiver to process VHF television signals.

5. A UHF adapter circuit for a vacuum tube television receiver of the type including a VHF tuner having a radio frequency amplifier including an input grid circuit for receiving intercepted VHF signals and an output plate circuit for developing an amplified replica of signals applied to said input grid circuit, said output plate circuit including a load resistor having a high potential terminal coupled to a source of energizing potential in said television receiver and a low potential terminal coupled to the plate electrode of said radio frequency amplifier, said VHF tuner also including a VHF local oscillator for generating oscillatory signals and a mixer for mixing said VHF and oscillatory signals to convert said VHF signals to intermediate frequency signals, said television receiver also including an intermediate frequency amplifier for amplifying said intermediate frequency signals, a high impedance automatic gain control circuit coupled to said intermediate frequency amplifier for developing a gain control voltage as a function of received signal levels, and means for applying said gain control voltage to the input grid circuit of said radio frequency amplifier to control the gain thereof said UHF adaptor circuit comprising in combination:

a UHF tuner for selecting any one of a plurality of UHF signals and converting said UHF signal to said intermediate frequency signal, a transistor intermediate frequency preamplifier capable of being automatically gain controlled and having an input electrode coupled to said UHF tuner and an output electrode, a voltage divider circuit having an intermediate point coupled to the input electrode of said transistor preamplifier, and switching means for selectively adapting said receiver to process one of said UHF and said VHF signals, said switching means having a first switch section for coupling said UHF tuner and said transistor preamplifier to said source of energizing potential and simultaneously decoupling said local oscillator and said mixer from said source of energizing potential during UHF signal reception, a second switch section for coupling said low potential terminal of the load resistor of said radio frequency amplifier to said voltage divider circuit during UHF signal reception to apply an amplified version of the said automatic gain voltage developed across said load resistor to said transistor preamplifier to control the gain thereof, and a third switch section for coupling the output electrode of said transistor preamplifier to the intermediate frequency amplifier of said television receiver and simultaneously decoupling said VHF tuner from said intermediate frequency amplifier during UHF signal reception.

6. A UHF adapter circuit for a vacuum tube television receiver of the type having a VHF tuner including a radio frequency amplifier having an input grid circuit for receiving intercepted VHF signals and an output plate circuit for delivering an amplified replica of the signals applied to said grid circuit, said output plate circuit including a load resistor having a high potential terminal coupled to a source of energizing potential in said television receiver and a low potential terminal coupled to the plate electrode of said radio frequency amplifier, said VHF tuner also including a VHF local oscillator for generating oscillatory signals and a mixer for mixing said VHF and oscillatory signals to convert said VHF signals to intermediate frequency signals, said television receiver also including an intermediate frequency amplifier for amplifying said intermediate frequency signals, a high impedance automatic gain control circuit coupled to said intermediate frequency amplifier for developing a gain control voltage as a function of received signal levels, and means for applying said gain control voltage to the input grid circuit of said radio frequency amplifier to control the gain thereof, said UHF adaptor circuit comprising in combination:

a UHF tuner for selecting any one of a plurality of UHF television signals and converting said UHF signal to said intermediate frequency signal, a transistor intermediate frequency preamplifier having an input circuit coupled to said UHF tuner and an output circuit, first switching means for energizing said UHF tuner and said transistor preamplifier while simultaneously deenergizing said VHF local oscillator and said mixer during UHF signal reception, second switching means for coupling the low potential terminal of the load resistor of said radio frequency amplifier to the input circuit of said transistor preamplifier to apply an amplifier version of said automatic gain control voltage to said preamplifier to control the gain thereof during UHF signal reception, and third switching means for coupling the output circuit of said transistor preamplifier to the intermediate frequency amplifier of said television receiver while simultaneously decoupling said VHF tuner from said intermediate frequency amplifier during UHF signal reception.

7. A UHF adapter circuit for a vacuum tube television receiver of the type including a VHF tuner having a radio frequency amplifier for amplifying VHF television signals, a local oscillator for generating oscillatory signals, and a mixer for mixing said VHF and oscillatory signals to convert said VHF signals to intermediate frequency signals, said radio frequency amplifier including a load resistor having a high potential terminal coupled to a source of energizing potential in said television receiver and a low potential terminal coupled to the plate electrode of said radio frequency amplifier, said television receiver also including an intermediate frequency amplifier for amplifying said intermediate frequency signals, a high impedance automatic gain control circuit coupled to said intermediate frequency amplifier for developing a gain control voltage as a function of received signal levels, and means for applying said gain control voltage to the grid of said radio frequency amplifier to control the gain thereof, said UHF adaptor circuit comprising in combination:

a UHF tuner for selecting any one of a plurality of UHF television signals and converting said UHF signal to said intermediate frequency signal, a transistor intermediate frequency preamplifier having an input circuit coupled to said UHF tuner and an output circuit, multisection switching means having first and second positions for selectively adapting said receiver to process said UHF and said VHF signals respectively, said switching means including, a first switch section having a first, a second and a common terminal, means coupling said common terminal to said source of energizing potential, means coupling said UHF tuner and said transistor preamplifier to said first terminal to energize said UHF tuner and said transistor preamplifier when said switching means is in said first position, means coupling said local oscillator and said mixer in said VHF tuner to said second terminal to energize said local oscillator and said mixer when said switching means is in said second position, means coupling the high potential terminal of said load resistor to said common terminal to maintain said radio frequency amplifier energized in both the first and second positions of said switching means, a second switch section having a first, a second and a common terminal, means coupling the low potential terminal of said load resistor to said common terminal, a voltage divider coupled between the first terminal of said second switch section and circuit ground in said television receiver, means coupling an intermediate point in said voltage divider to the input circuit of said transistor preamplifier to apply the amplified automatic gain control voltage developed across said load resistor so as to control the gain of said transistor preamplifier when said switching means is in said first position, and a third switch section having a first, a second and a common terminal, means coupling the intermediate frequency amplifier of said television receiver to said common terminal, means coupling the output circuit of said transistor preamplifier to the first terminal of said third switch section to apply the intermediate frequency signal from said UHF tuner to said intermediate frequency amplifier when said switching means is in said first position, and means coupling said VHF tuner to the second terminal of said third switch section to apply the intermediate frequency signal from said VHF tuner to said intermediate frequency amplifier when said switching means is in said second position.

References Cited by the Examiner

UNITED STATES PATENTS

| | | | |
|---|---|---|---|
| 2,750,496 | 6/1956 | Horowitz et al. | 325—491 XR |
| 2,873,360 | 2/1959 | Lyman | 325—491 XR |

ROBERT H. ROSE, *Primary Examiner.*

DAVID G. REDINBAUGH, *Examiner.*